United States Patent [19]

Rittenbach

[11] 4,398,153
[45] Aug. 9, 1983

[54] HARMONIC GENERATOR

[75] Inventor: Otto E. Rittenbach, Neptune, N.J.

[73] Assignee: The United States of America as represented by the Secretary of the Army, Washington, D.C.

[21] Appl. No.: 260,868

[22] Filed: May 6, 1981

[51] Int. Cl.³ .............................................. H03B 5/00
[52] U.S. Cl. ...................................... 328/16; 328/20; 330/279; 331/183
[58] Field of Search .................... 328/16, 20; 330/279; 331/183

[56] References Cited

U.S. PATENT DOCUMENTS

| | | | |
|---|---|---|---|
| 3,402,360 | 9/1968 | Millon | 330/279 |
| 3,533,010 | 10/1970 | Bowles | 331/183 |
| 3,571,627 | 3/1971 | Cardon et al. | 328/16 |
| 3,706,048 | 12/1972 | Johnston | 328/16 |
| 3,944,945 | 3/1976 | Corte et al. | 331/183 |
| 3,979,693 | 9/1976 | Saari | 331/183 |
| 4,213,097 | 7/1980 | Chiu et al. | 330/279 |

*Primary Examiner*—John S. Heyman
*Attorney, Agent, or Firm*—Robert P. Gibson; Jeremiah G. Murray; Michael C. Sachs

[57] ABSTRACT

A harmonic frequency generator responsive to an input signal of frequency f which changes slowly in both frequency and amplitude and characterized in that (1) the output signal (harmonic) amplitude remains proportional to the input signal amplitude and (2) the output frequency nf of the output signal consists soley of one integral (n>1) multiple of the input signal frequency.

9 Claims, 18 Drawing Figures

HARMONIC GENERATOR

The invention described herein may be manufactured, used, and licensed by or for the Government for Governmental purposes without the payment to me of any royalties thereon.

BACKGROUND AND SUMMARY OF INVENTION

One approach for obtaining second or higher harmonics has been to use a nonlinear element such as a diode which generates several harmonics and to filter out the undesired harmonics. Such an approach operates satisfactorily only if the input signal does not change appreciably in frequency, however. Otherwise, the frequency band of the various (including adjacent) harmonics of changing frequency overlap and cannot be separated by band pass filter.

Widely varying input frequencies of the input signal can sometimes be taken care of with a system using frequency conversion and single side band filtering, but such a system is too complex and expensive for many applications.

In accordance with this invention, the input signal of frequency f is applied to a gain controlled amplifier; this amplifier is disposed in a feedback loop which further includes a low pass filter and at least one non-linear element, such as a squarer or two input multipliers in the output of the gain controlled amplifier. The output of the non-linear element may be passed through a high pass (or band pass) filter to provide the output signal of harmonic frequency nf.

DESCRIPTION OF FIGURES OF DRAWING

FIG. 1 describes the basic operation of a squarer such as used in the circuits of FIGS. 3, 8 and 12;

FIG. 2 describes the basic operation of an analog multiplier such as used in the circuits of FIGS. 4 to 7, or 9 to 11, or 13 to 15;

DETAILED DESCRIPTION OF EMBODIMENTS OF INVENTION

Figure 1:
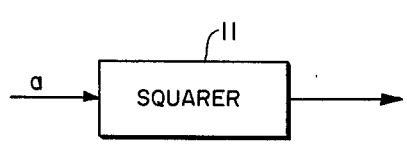
Figure 2:
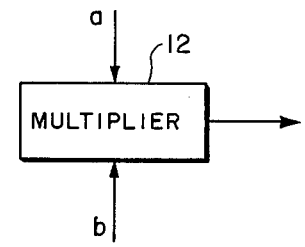

FIGS. 1 and 2 show the relationship between input and output signal of a squarer 11 and analog multiplier 12, respectively, such as used in the circuits of the invention. The squarer 11 of FIG. 1 provides an output $a^2/c^2$ where $C^2$ is the gain factor of the squarer; this gain factor may be greater or less then unity, depending upon whether the squarer introduces gain or attenuation. For input signals of amplitude a and b to the multiplier 12 of FIG. 2, an output $ab/c^2$ is provided where $C^2$ is the multiplier gain factor, as in the case of the squarer 11 of FIG. 1.

Figure 3:
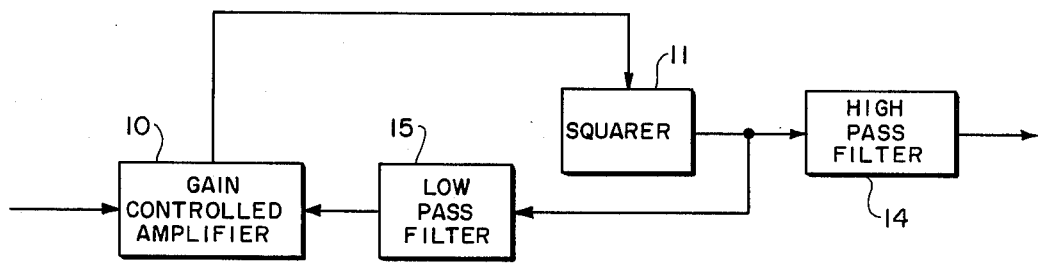
FIG. 3 is a frequency doubler circuit using a squarer as the non-linear element in the feedback loop of the gain-controlled amplifier.

Before proceeding with the discussion of the circuits of FIG. 3 et seq., the mathematical term $\angle \alpha$ is now introduced as a simplifier equivalent of the real part of $e^{j\alpha} = e^{jwt}$ The term $\angle \alpha$ thus is equivalent to cos $wt$ = cos $2\pi ft$.

FIG. 3 illustrates a first embodiment of a frequency doubler wherein an alternating current input signal of amplitude A and frequency f, herein designated as $A\angle \alpha$, is supplied to a gain-controlled amplifier 10. The gain of amplifier 10 is controlled by an input bias voltage and is equal to $C/\sqrt{A}$ when the bias is properly set at a value A/2. The factor C of the amplifier 10 is dependent upon the multiplier constant $1/C^2$ of the squarer 11.

To avoid having the magnitude A of the input signal squared at the circuit output, one needs an amplifier which will privide a gain of $\sqrt{A}$ so that the amplifier output applied to the squarer (or multiplier in some cases) will be $\sqrt{A}$ for all values of A. This cannot be accomplished with a fixed gain amplifier so a variable gain amplifier is used in a feedback circuit to insure proper square rooting of the input signal amplitude for all values of the input signal.

The bias characteristics of the amplifier 10 is such that the output is $C\sqrt{A}\angle \alpha$ for a bias voltage of A/2. The output of amplifier 10 of FIG. 3 is applied to the squarer circuit 11. The output of the squarer 11 is given by $$\frac{(C\sqrt{A})^2(\angle\alpha)^2}{C^2} = A(\angle\alpha)^2 = A\cos^2 wt$$

The output $A\cos wt$ can be rewritten as $A/2+(A/2)\cos 2wt$. In other words, the output $A(\angle\alpha)^2$ can be broken down into a d.c. component $A/2$ and an alternating component $(A/2\angle 2\alpha)$. By means of high pass filter 14 the d.c. component $A/2$ can be removed so that an output $(A/2)\angle 2\alpha$ is derived. This output signal is of double the frequency of the input signal, but of half the amplitude of the input signal.

The output of the squarer $A(\angle\alpha)^2$ is also applied to low pass filter 15 which removes the a.c. component $(A/2)\angle 2\alpha$, leaving the d.c. voltage $A/2$; this latter voltage then is applied to the gain controlled amplifier 10 as a bias voltage.

If the input signal $A\angle\alpha$ is small, as at the time the equipment is first set into operation, the amplitude of the amplifier output $C\sqrt{A}\angle\alpha$ likewise is small, and the squared output and the dc component $A/2$ derived from low pass filter 15 are correspondingly small. This low bias voltage causes the gain of the amplifier 10 to increase. The reverse procedure attains for an increase in input signal amplifier A. Thus, the low pass filter 15 and squarer 11 form part of the gain-controlling feedback network or loop for amplifier 10.

Figure 4:
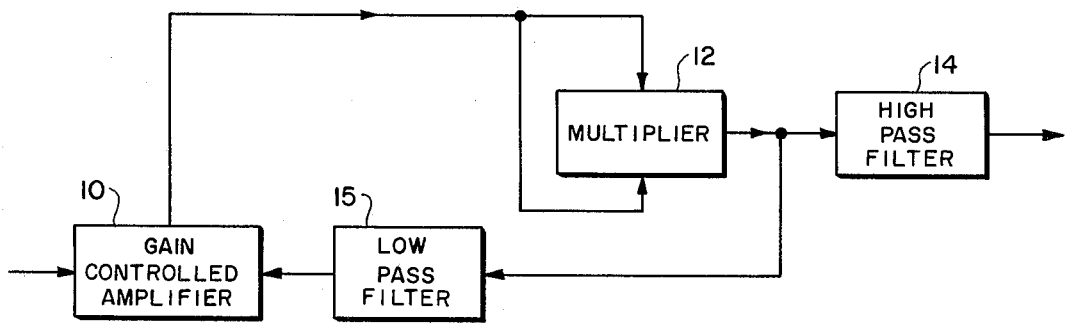
FIG. 4 is a frequency doubler circuit similar to FIG. 3 but using an analog multiplier instead of a squarer.

An alternative frequency doubler circuit to that of FIG. 3 is shown in FIG. 4 and uses the analog multiplier of FIG. 2 as the non-linear element in the feedback loop rather than the squarer 11 in the circuit of FIG. 3. The remainder of the circuit of FIG. 4 is the same as that of FIG. 3 and corresponding elements in FIGS. 3 and 4 are indicated by like reference numerals. The two-inputs to multiplier 12 of FIG. 4 are derived from the same output, that is, the output of gain controlled amplifier 10. When the two identical inputs $C\sqrt{A}\angle\alpha$ are multiplied, the output is $(C\sqrt{A}\angle\alpha)\cdot(C\sqrt{A}\angle\alpha)/C^2$, See FIG. 2. The product is the same as that derived from the squarer 11 of FIG. 1, viz., $A(\angle\alpha)^2$, and, likewise, the final output $(A/2)\angle 2\alpha$ is the same as that derived in the circuit of FIG. 3. The gain factor C for the amplifier output is chosen dependent upon the multiplier constant $1/C^2$ for the particular multiplier 12 used in circuit therewith. However, the multiplier does not need to have both inputs equal. This degree of freedom can be used in different ways, e.g., in FIG. 4A, the same result as in FIG. 4 may be obtained by having only one signal from the gain controlled amplifier connected to one of the multiplier terminals, the other terminal might be fed from the $A\angle\alpha$ input signal, directly. Of course, AGC gain would have to be chosen so as to have the multiplier output equal to $A\angle(\alpha)^2$.

Figure 4A:
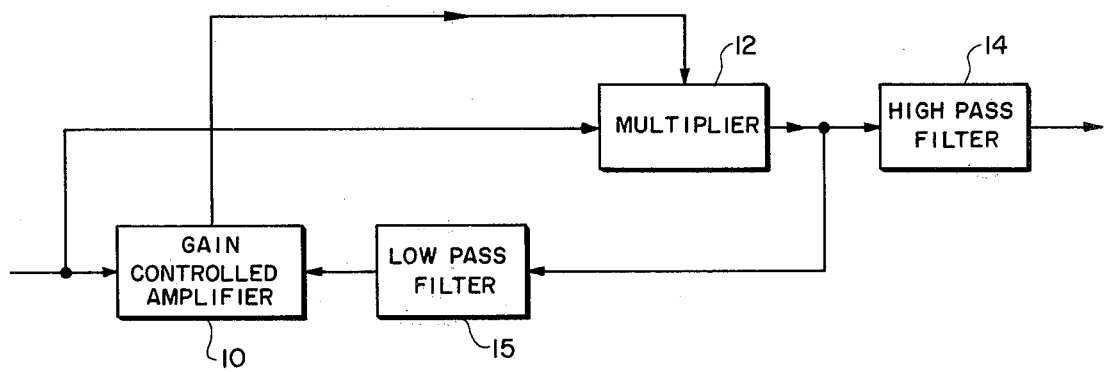
FIG. 4A shows a frequency doubler similar to that of FIG. 4.

As the input voltage is increased, a level is obtained at which distortion in the output of the squarer 11 and the multiplier 12 exceeds acceptable limits. The maximum voltage output before said distortion occurs is called max or M. In the circuits of FIGS. 3, 4, and 4A, the final output at this level M is reduced by half.

Figure 5:
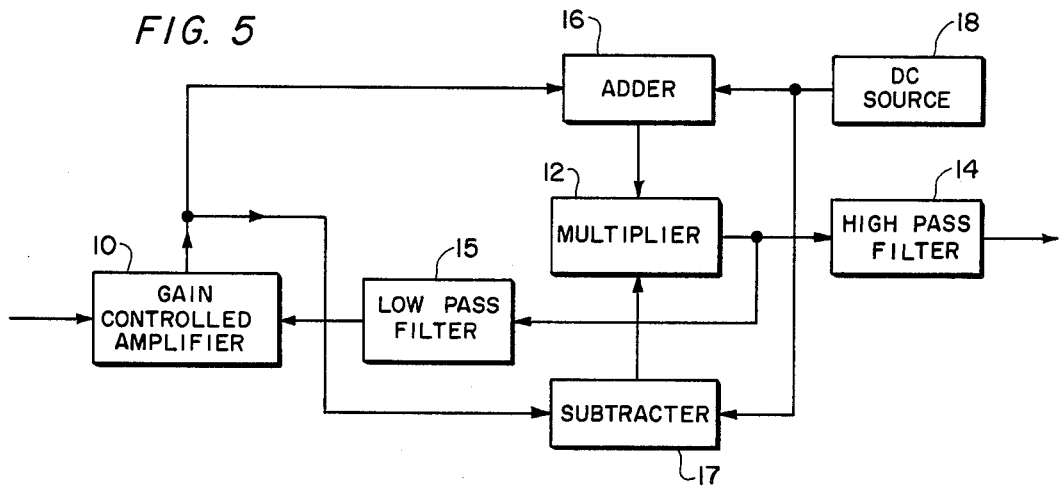
FIG. 5 is a frequency doubler circuit in which a dc bias is added to and subtracted from the gain-controlled amplifier output prior to multiplication.

A disadvantage of the circuits of FIG. 3, is that a 6 db loss of signal ensues because of the reduction of the output signal amplitude by half. This reduction can be avoided using the degree of freedom by means of the circuit of FIG. 5 wherein, in addition to the components 10, 12, 14 and 15 found in the circuit of FIG. 4, an adder 16 and subtractor 17 are used. In the circuit of FIG. 5, the bias of the gain-controlled amplifier 10 is such as to maintain a gain of $\sqrt{2}$ times that obtained in the circuits of FIGS. 3 and 4, namely $C\sqrt{2A}\angle\alpha$. The gain of amplifier 10 is $C\sqrt{2}/\sqrt{A}$ for the proper bias of A-M. The output of gain-controlled amplifier 10 is applied to both adder 16 and subtractor 17 prior to multiplication. Also applied to both adder 16 and subtractor 17 is a voltage $C\sqrt{M}$ from a d.c. source 18. As stated previously, M represents the maximum value of the undistorted multiplier output and is a known characteristic of the particular multiplier 12 being used.

The output of the adder 16 is $C(\sqrt{2A}\angle\alpha+\sqrt{M})$, while the output of subtractor 17 is $C(\sqrt{2A}\angle\alpha-\sqrt{M})$. When these outputs are multiplied by multiplier 12 the resultant output is $$(A-M)+A\angle 2\alpha$$

The a.c. term $A\angle 2\alpha$ is removed by the low pass filter 15 to yield a bias control voltage $(A-M)$ for gain-controlled amplifier 10. In addition, the d.c. term $(A-M)$ is removed by the high pass filter to yield the a.c. output signal $A\angle 2\alpha$. With the circuit of FIG. 5, the final output $A\angle 2\alpha$ is not diminished by a factor of two, as in the circuits of FIG. 3 and 4.

Figure 6:
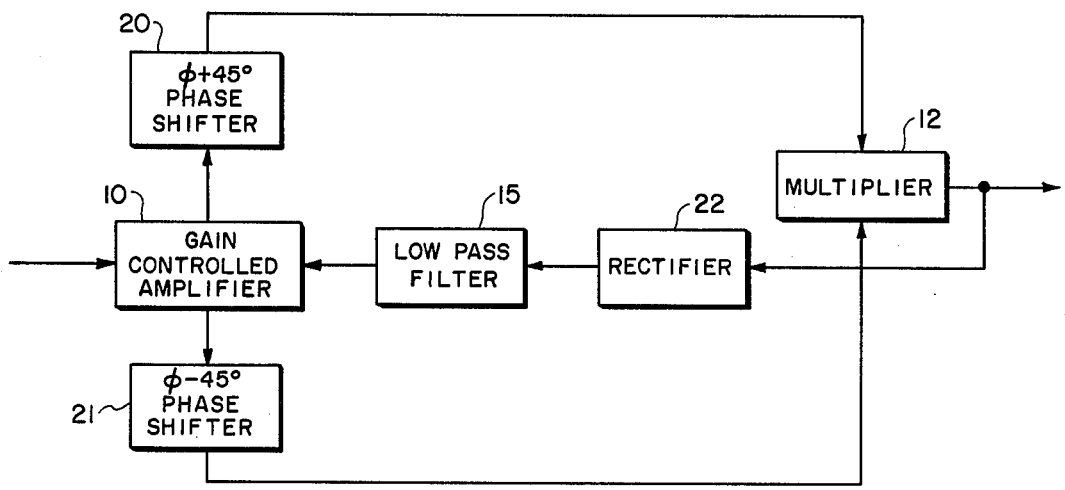
FIG. 6 is a frequency doubler circuit in which +45° and −45° phase shift are introduced into the output of the gain-controlled amplifier before multiplication.

Whereas an increase of 6 db in undistorted amplitude compared to FIG. 3 is obtained in the circuit of FIG. 5 by d.c. level shifting (by a level M) prior to multiplication in multiplier 12, the circuit shown in FIG. 6 achieves this amplitude increase using the degree of freedom by phase shifting by $+45°$ and $-45°$ before multiplication. The gain of gain-controlled amplifier 10 now is $C\sqrt{2}/\sqrt{A}$ when the bias is properly set, that is, $2A/\pi$. The output of the amplifier 10, namely $C\sqrt{2A}\angle\alpha$, is applied to phase shifters 20 and 21 which introduce a built-in phase shift of $\phi+45°$ and $\phi-45°$, respectively, where $\phi$ is a value of phase shift dependent upon the frequency. The outputs from phase shifters 20 and 21 are, respectively, $C\sqrt{2A}\angle\alpha+\phi\pm 45°$. These phase-shifted ouputs are applied to multiplier 12 and the product $C^2 2A\angle 2\alpha+2\phi/2C^2 = A\angle 2\alpha+2\phi$ is obtained This can be written as $$2A[\cos(\alpha+\phi+45°)\cos(\alpha+\phi-45°)],$$

which reduces to $A\angle 2(\alpha+\phi)$.

This output from multiplier 12 is available as the output signal and is double the frequency of the input signal $A\angle\alpha$ and of the same amplitude. A phase shift of $\phi$ has been introduced into the output signal; however, this need not be bothersome, particularly when audio detection is used, since a phase shift is not audible.

The multiplier 12 output is also applied to a full wave rectifier 22 and the magnitude of the output thereof is given by $|A\angle 2(\alpha+\phi)|$. This full wave rectified output is applied to low pass filter 15 which operates on the full-wave rectified output to provide an average level of magnitude $2A/\pi$. It is this voltage which is applied to the bias control of the gain-controlled amplifier 10. The circuit of FIG. 6 does not, like the previous circuits of FIGS. 3 to 5, require a high pass filter, but it does require a full wave rectifier.

In certain applications, such as the balanced radar signal processing system described in my copending application Ser. No. 122,217 entitled "Signal Processing System" filed Feb. 19, 1980, a pair of broadband signals are derived. For example, in FIG. 1 of said application, a quadrature phase broadband signal appears at terminal Q and an in-phase broadband signal appears at terminal I. These terminals provide two quadratrue signals which can be represented in FIG. 7 by the expression $A\angle\alpha+45°$ and $A\angle\alpha-45°$. The portion of the radar signal processor shown in FIG. 1 of my copending application preceding terminals Q and I is indicated in FIG. 7 by a block numbered 9. The system of FIG. 7 is particularly adapted for use with radar detection systems using quadrature signals, such as that above referred to. The actual input signal to the processor 9 is of a higher frequency than the phase-shifted signals $A\angle 60+45°$ and $A\angle\alpha-45°$ when the aforesaid processing system is used. The input signal in FIG. 7 is $A\angle\alpha+\Omega t$. It will be noted that the circuit of FIG. 7 requires two gain-controlled amplifiers 10A and 10B.

The input signals $A\angle\alpha+45°$ and $A\angle\alpha-45°$ of FIG. 7 are amplified by respective gain-controlled amplifiers 10A and 10B, each of gain $C\sqrt{2}/A$ to provide respective outputs $C\sqrt{2}A\angle\alpha+45°$ and $C\sqrt{2}A\angle\alpha-45°$. After multiplication by multiplier 12, dn output is obtained which is given by $$2A(\angle\alpha+45°)(\angle\alpha-45°)$$

which can be rewritten as $2A[\cos(\alpha+45°)\cos(\alpha-45°)]$. This is equivalent to $$2A\cdot\tfrac{1}{2}\{\cos[(\alpha+45°)-(\alpha-45°)]+\cos[(\alpha+45°)+(\alpha-45°)]\}$$

which reduces to $A(\cos 90°+\cos 2\alpha)=A\cos 2\alpha=A\angle 2\alpha$.

This output from multiplier 12 becomes the output signal, as well as the input to full wave rectifier 22. The rectified full wave output $|A\angle 2\alpha|$ of rectifier 22, after filtering in low pass filter 15, is of amplitude $2A/\pi$ and is applied as the bias voltage to each of gain controlled amplifiers 10A and 10B. The output signal $A\angle 2\alpha$ is twice the frequency of the quadrature input signals $A\angle\alpha+45°$ and $A\angle\alpha-45°$.

The circuit of FIG. 7, like that of FIG. 6, requires an added rectifier, as compared with the circuits of FIGS. 3 to 5, but does not require a high pass filter in the output circuit. In contrast with the circuit of FIG. 6, the circuit of FIG. 7 requires an additional gain-controlled amplifier. The output signal of the circuit of FIG. 7, however, does not have the built-in phase shift $\phi$ as in the case of the circuit of FIG. 6. In FIG. 7, the circuit of FIG. 6 has been used except that no phase shifters are included. This is because the outputs of the signal processor 9 are already phase shifted. As mentioned, block 9 is an element found in the prior art.

While FIG. 7 is a viable embodiment to obtain the desired harmonics, it is to be noted that two AGC amplifiers are required. Such devices being expensive, one may refer to the circuit of FIG. 7A wherein only one AGC amplifier is needed. Such is accomplished using the degree of freedom by leading one input directly to the multiplier circuit and having the one AGC amplifier arranged to deliver an output of suitable gain for eliminating d.c. at the multiplier output.

The circuits of FIGS. 3 to 7A are frequency doublers. The circuits of FIGS. 8 to 11, about to be described, are frequency quadruplers.

Figure 8:
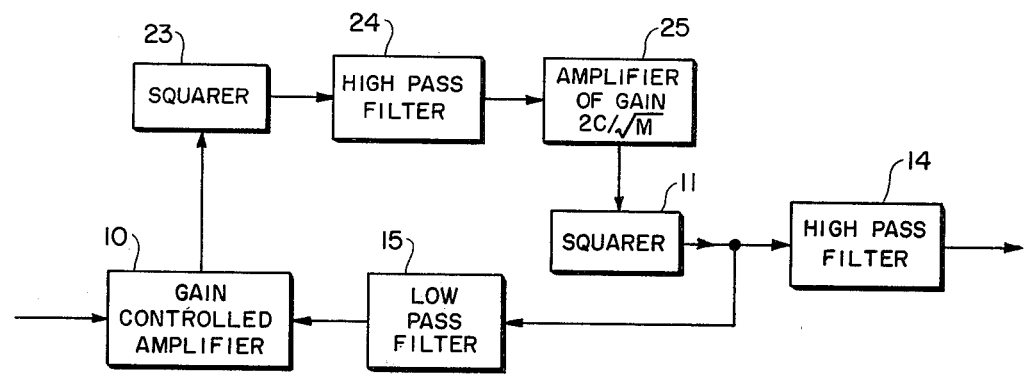
FIG. 8 is a frequency quadrupler circuit corresponding to the doubler circuit of FIG. 3 but including an additional squarer.

The first of these quadruplers, shown in FIG. 8, differs from the circuit of FIG. 3 in that it includes an additional squarer 23, an additional high pass filter 24 and an added amplifier 25. The input signal $A\angle\alpha$ is amplified by gain controlled amplifier 10 to a level $C\sqrt[4]{MA}\angle\alpha$ where M is the maximum undistorted output of the squarer 23. For the greatest magnitude of input voltage, $A=M$, the output amplitude becomes equal to $C\sqrt{A}$. The input to squarer 23 is such that, for maximum output, one is operating just below the saturation region of the squarer, so that maximum of the squarer output amplitude results.

The output from gain control amplifier is squared by means of squarer 23 to provide a level $\sqrt{MA}(\angle\alpha)^2$. This squared output can be rewritten as $$\frac{\sqrt{MA}}{2}+\frac{\sqrt{MA}}{2}\cdot\cos 2\alpha.$$

This squared output from squarer 23 is passed through a high pass filter 24 which gets rid of the d.c. term $\sqrt{MA}/2$ from the squarer output. The output of the high pass filter 24 is $\sqrt{MA}/2\sqrt{2\alpha}$ which is applied to the amplifier 25 of gain $=2C/\sqrt{M}$. The output $C\sqrt{A}\angle 2\alpha$ of amplifier 25 is squared by squarer 11 to produce an output $C^2A(\angle 2\alpha)^2/C^2=A(\angle 2\alpha)^2$. The squarer 11 output is applied to low pass filter 15 which removes the accomponent $(A/2)\cos 2\alpha$, leaving only the d.c. component $A/2$ which is applied as a bias voltage to the gain controlled amplifier 10. The output of 14 eliminates the dc component and passes the a.c. component of $A/2(\angle 2\alpha)^2$, that is $A/2\sqrt{4\alpha}$. The frequency of the input signal $A\angle\alpha$ thus has been quadupled, albeit with a reduction in amplitude by one half.

The amplifier 25 is used in the circuit of FIG. 8 to permit both squarers 11 and 23 to saturate at the greatest permissible input voltage $(A=M)$. The level at the output of high pass filter 24 applied to amplifier 25 is less than that of squarer 23 as a result of removing the dc component in high pass filter 24.

Figure 9:
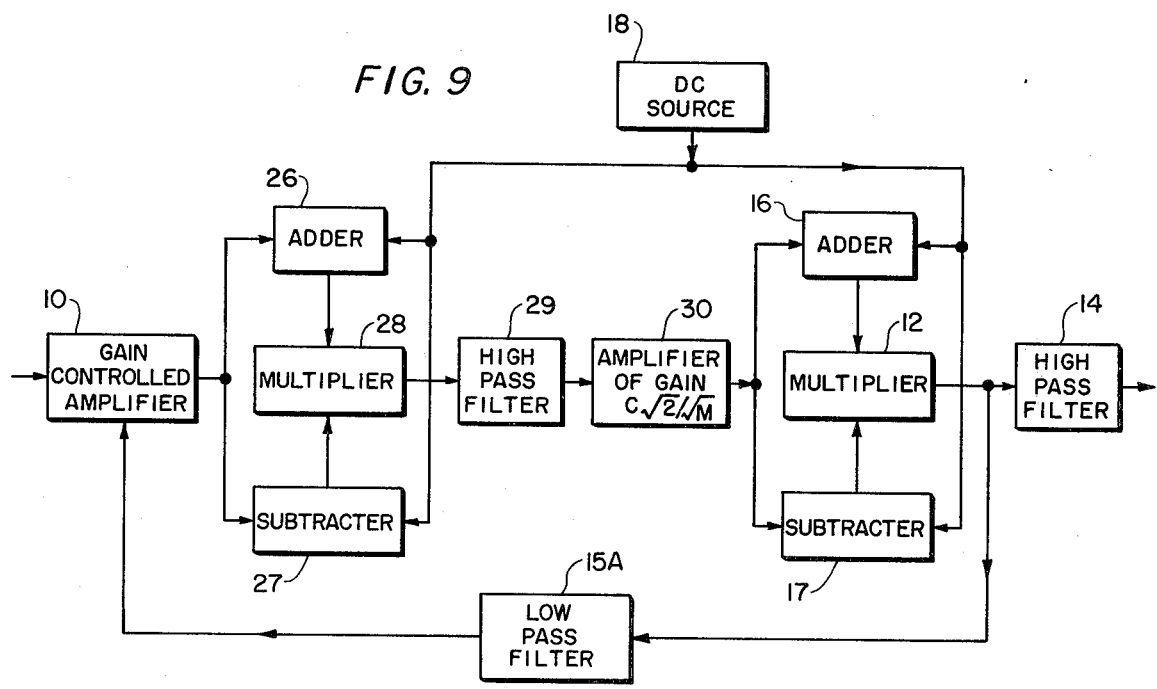
FIG. 9 is a frequency quadrupler circuit corresponding to the doubler circuit of FIG. 5 but including an additional stage of each multiplication, addition and subtraction.

The quadrupler circuit of FIG. 9 has an advantage over that of FIG. 8 in that the maximum output signal amplitude is not reduced. The frequency quadrupler circuit of FIG. 9 differs from the corresponding frequency doubler circuit of FIG. 5 in further requiring an adder 26, a subtractor 27, a multiplier 28 and a high pass filter 29. In addition, an extra amplifier 30 is needed for the same reason as the amplifier 25 in the circuit of FIG. 8.

The input signal A is amplified in gain-controlled amplifier 10 which has a gain of $C\sqrt{2\sqrt[4]{M}/A^3}$ for a bias voltage of $(A-M)$. The output of amplifier 10 is applied to one input of each of the adder 26 and the subtractor 27. The other input to adder 26 and subtractor 27 is the d.c. level $C\sqrt{M}$ derived from d.c. source 18. The output of adder 26 is $C\sqrt{2\sqrt[4]{AM}\angle\alpha+\sqrt{M}}$ which forms one input to multiplier 28. The output of subtractor 27 is $C(\sqrt{2\sqrt[4]{AM}\angle\alpha-\sqrt{M}})$ which forms the other input to multiplier 28. The product from multiplier 28 is $$\frac{2C^2\sqrt{AM}(\angle\alpha)^2-\sqrt{M^2}}{C^2}=2\sqrt{AM}(\angle\alpha)^2-M.$$

This output can be represented as $$2\sqrt{AM}\cos^2\alpha-M=\sqrt{AM}-M+\sqrt{AM}\angle 2\alpha.$$

The d.c. component $\sqrt{AM}-M$ of the output of multiplier 28 is removed by high pass filter 29 and the a.c.

component $\sqrt{AM} \angle 2\alpha$ is applied to amplifier 30 of gain $C\sqrt{2/M}$. The resultant output of amplifier 30 is $C\sqrt{2A} \angle 2\alpha$.

This output from amplifier 30 is applied to one input of adder 16 and subtractor 17. The sum $C(\sqrt{2A}\angle 2\alpha + \sqrt{M})$ from adder 16 and the difference $C(\sqrt{2A}\angle 2\alpha - M)$ from subtractor 17 is multiplied by multiplier 12 to provide the output $2A(\angle 2\alpha)^2 - M$. This multiplier output can also be written as $2A(\cos^2 2\alpha) - M$ which equals $A - M + A\angle 4\alpha$.

The a.c. component $A\angle 4\alpha$ of the multiplied output is removed by the low pass filter 15A, leaving the d.c. compoent $A - M$ for a bias control voltage for voltage controlled amplifier 10. The a.c. component $A\angle 4\alpha$ of the multiplier 12 output is passed by high pass filter 14 to provide the final output signal $A\angle 4\alpha$ which is of the same magnitude as the input signal $A\angle \alpha$ but of quadruple the frequency.

Figure 10:
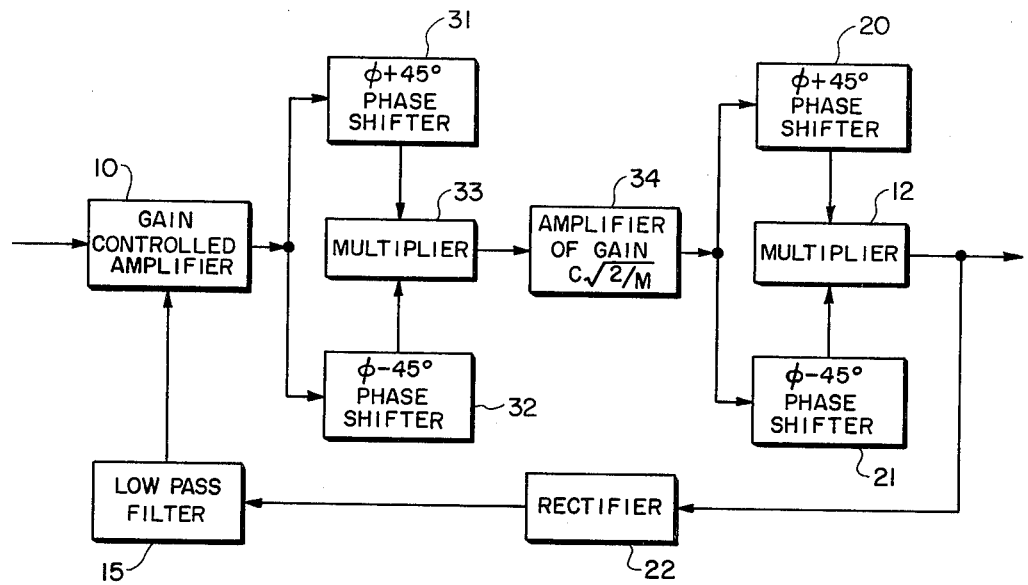
FIG. 10 is a frequency quadrupler circuit corresponding to the doubler circuit of FIG. 6 but including an additional stage of each quadrature phase shifting and multiplication.

The frequency quadrupler circuit of FIG. 10 corresponds to the frequency doubler circuit of FIG. 6 except that the added $\phi+45°$ phase shifter 31, $\phi-45°$ phase shifter 32, multiplier 33 and amplifier 34 are required. The output of the gain-controlled amplifier 10, where gain is $C\sqrt{2}\sqrt[4]{M}/\sqrt[4]{A^3}$, is $C\sqrt{2}\sqrt[4]{MA}\angle \alpha$. This amplified output is applied to phase shifters 31 and 32; the phase-shifted outputs are $C\sqrt{2}\sqrt[4]{MA}\angle \alpha+\phi+45°$, respectively. These phase-shifted outputs are multiplied by multiplier 33 to produce an output $\sqrt{MA}\angle 2(\alpha+\phi)$. This output is amplified by amplifier 34 of gain $C\sqrt{2/M}$ to provide an output $C\sqrt{2A}\angle 2(\alpha+\phi)$ which then is supplied to phase shifters 20 and 21 to produce respective phase-shifted outputs $$C\sqrt{2A} \angle 2(\alpha + \phi) \pm 45°.$$

After multiplication of these phase-shifted outputs by multiplier 12, they give $A\angle 4(\alpha+\phi)$.

This output signal $A\angle 4(\alpha+\phi)$ is four times the frequency of the input signal. As in the case of the doubler circuit of FIG. 6, a phase shift of $\phi$ has been introduced into the output signal, but is not critical in cases where audio signal detection is used. The output signal is further rectified by rectifier 22 and the d.c. voltage $|A\phi 4 - (\alpha + \phi)|$ is applied to low pass filter 15. The output of filter 15 provides a bias voltage $2A/\pi$ to the gain-controlled amplifier 10.

Figure 11:
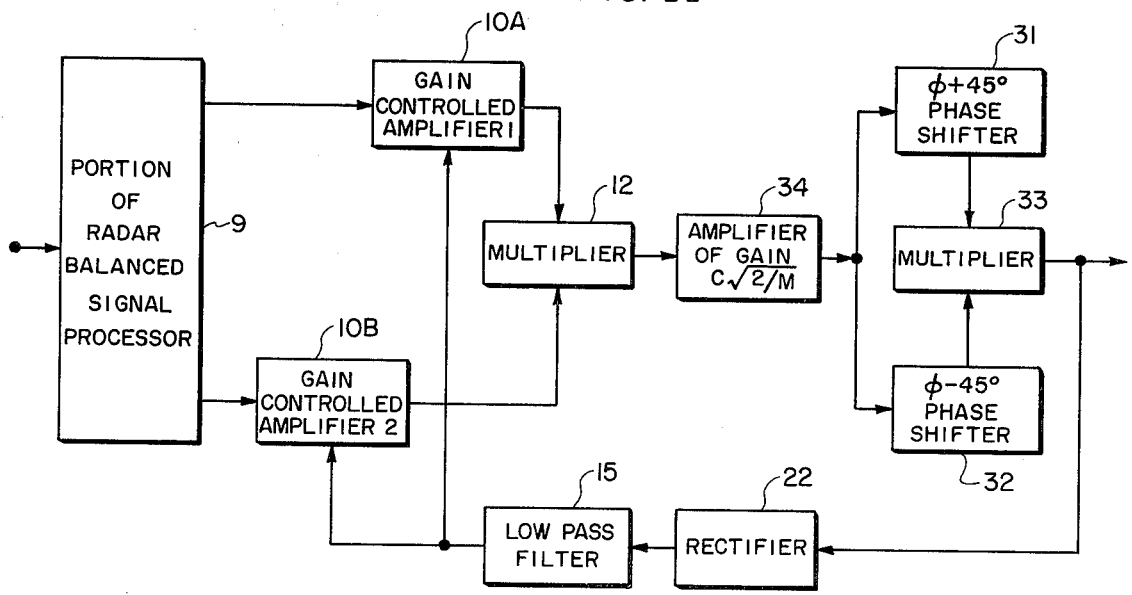
FIG. 11 is a frequency quadrupler circuit similar to FIG. 10 which is adapted for use with input signals in phase quadrature.

FIG. 11 illustrates a frequency quadrupler which corresponds to the frequency doubler circuit of FIG. 7 in that the $+45°$ and $-45°$ phase shifts are derived in the balanced signal processor 9. The circuit of FIG. 11 differs from that of FIG. 7 in that an additional multiplier 33, plus and minus 45° phase shifters 31 and 32 and amplifier 34 are needed (as in FIG. 10). The two quadrature outputs $A\angle \alpha+45°$ and $A\angle \alpha-45°$ are amplified in respective gain-controlled amplifiers 10A and 10B, each of gain $C\sqrt{2}\sqrt[4]{M}/\sqrt[4]{A^3}$ to produce respectively, outputs $C\sqrt{2}\sqrt[4]{MA}\angle \alpha\pm 45°$. Multiplication of these outputs by multiplier 12 yields an output $\sqrt{MA}\angle 2\alpha$. After amplification by amplifier 34 of gain $C\sqrt{2/M}$ an output $C\sqrt{2A}\angle 2\alpha$ is obtained which is applied to the phase shifters 31 and 32, respectively. These outputs of phase shifters 31 and 32 are multiplied by multiplier 33 to produce the output signal $A\angle 4\alpha+2\phi$ which is four times the frequency of the quadrature input signals $A\angle 2+45°$ and $A\angle \alpha-45°$. The operation of the phase shifters 31 and 32 and of multiplier 33 are the same as in FIG. 10. Also, as in FIG. 6, the rectified multiplier 33 output (output signal) of level $|A\angle 4\alpha+2\phi|$ is filtered by lowpass filter 15 to provide a control bias $2A/\pi$ to each of the gain-controlled amplifiers 10A and 10B.

Figure 7A:
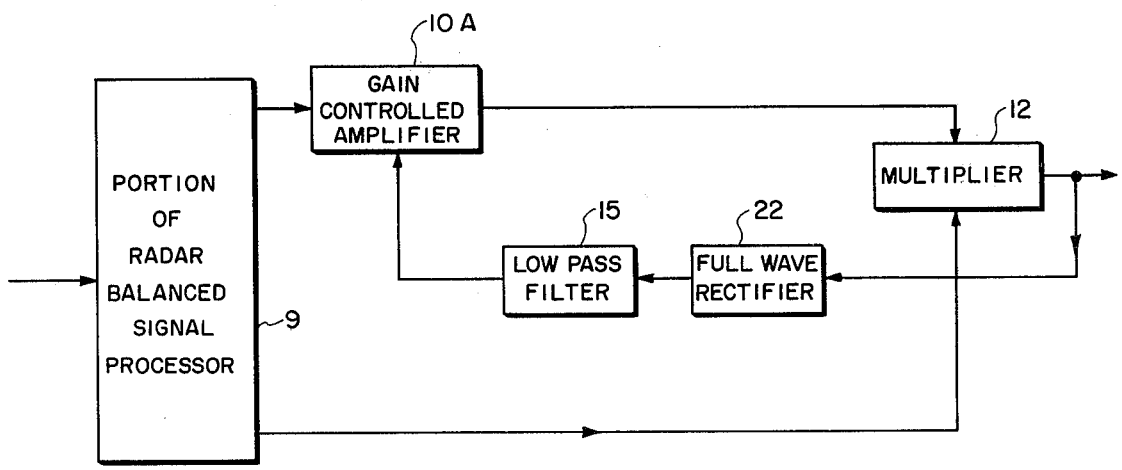
FIG. 7A shows a frequency doubler similar to that of FIG. 7 except that need of one of the AGC amplifiers has been eliminated.
Figure 7:
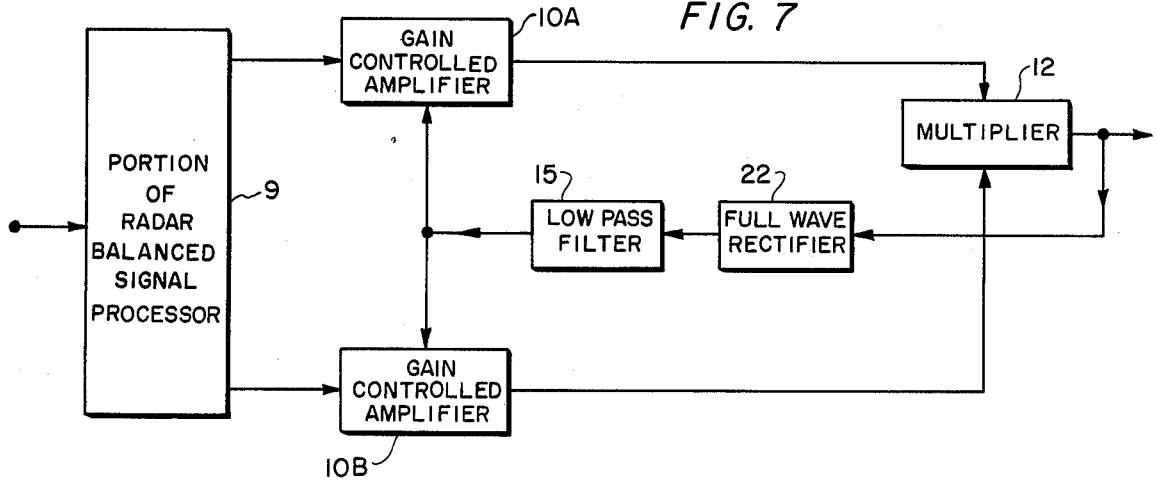
FIG. 7 is a frequency doubler circuit in which two signals in phase quadrature are presented to respective gain-controlled amplifiers prior to multiplication of the amplifiers' outputs.
Figure 11A:
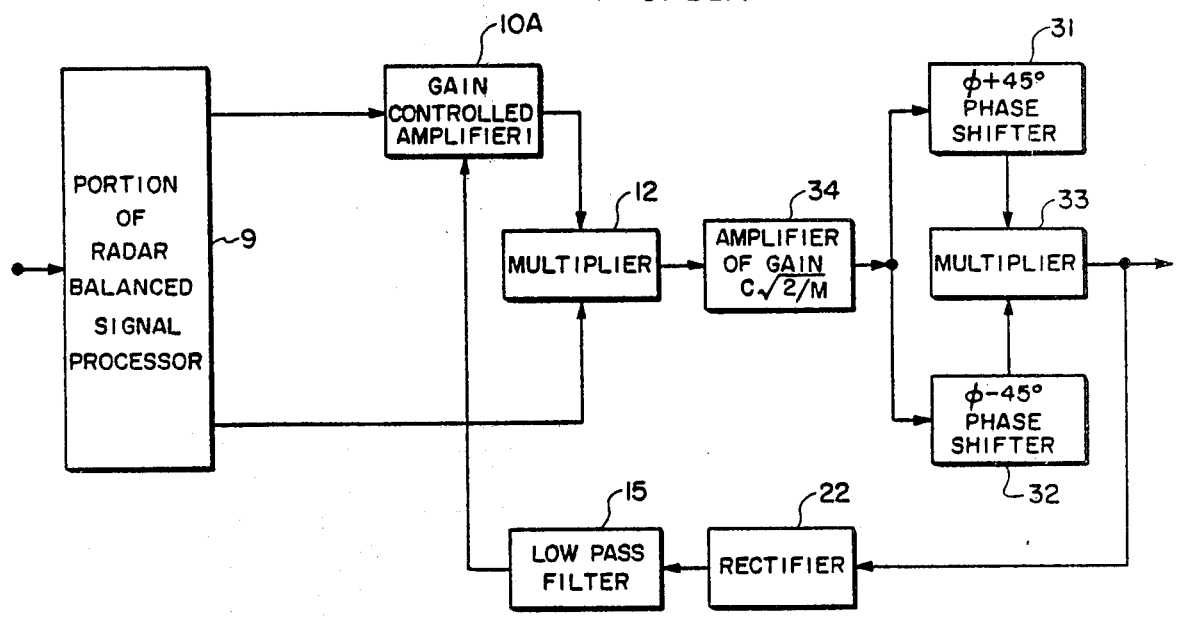
FIG. 11A shows a frequency quadrupler circuit similar to that of FIG. 11 except that only one AGC amplifier is needed.

In FIG. 11A, one (expensive) AGC amplifier circuit has been eliminated from the circuit of FIG. 11 in like manner as was done in FIG. 7A compared to FIG. 7. That is, an input fed directly to the multiplier circuit, while the gain and phase of the single AGC amplifier are selected properly so that, at the multiplier output there is no $A/2$, d.c. term.

FIGS. 12 to 15 illustrate four different embodiments of a frequency tripler which correspond, at least partially, to the frequency doublers of FIGS. 3 (and 4), 5, 6 and 7, respectively.

Figure 12:
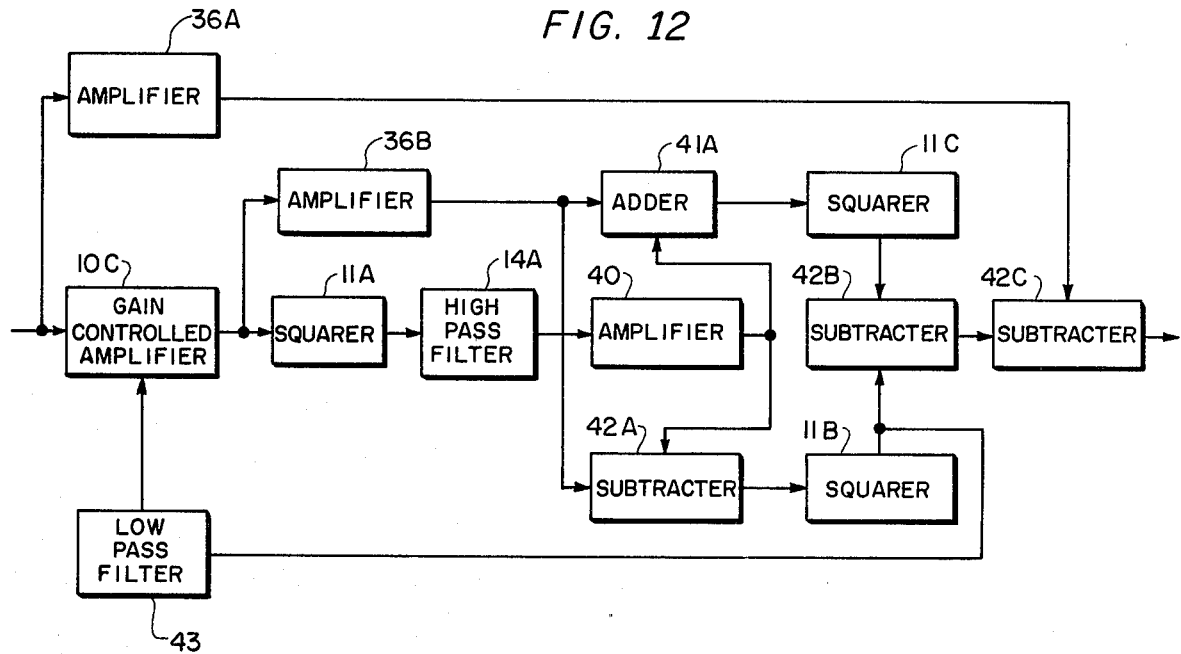
FIG. 12 is a frequency tripler circuit using squarers as non-linear elements.

Referring to FIG. 12, the input signal $A\angle \alpha$ is divided down in amplitude by 2 in amplifier 36A to yield the output $A/2\phi\alpha$. The input signal also is applied to gain controlled amplifier/OC to provide an output $C\sqrt[3]{A}\angle \alpha$, which, when squared by squarer //A, becomes equal to $\sqrt[3]{A^2}/2(1+\angle 2\alpha)$. After filtering in high pass filter 14A, the d.c. component $\sqrt[3]{A^2}/2$ is removed and the output $\sqrt[3]{A^2}/2\angle 2\alpha$ is supplied to the input of an amplifier 40. The output $C\sqrt[3]{A^2}/2\angle 2\alpha$ is added in adder 41A to the output of amplifier 36B ($C\sqrt[3]{A}/2\angle \alpha$), which amplifier is fed from gain controlled amplifier 10C, to provide an output $C/2(\sqrt[3]{A}\angle \alpha) + \sqrt[3]{A^2}\angle 2\alpha)$. The latter output is squared by squarer 11C to obtain $(\sqrt[3]{A}\angle \alpha + \sqrt[3]{A^2}\angle 2\alpha)^2/4$.

This can be written as:

$$\frac{(\sqrt[3]{A}\angle \alpha)^2}{4} + \frac{A\angle \alpha \angle 2\alpha}{2} + \frac{(\sqrt[3]{A^2}\angle 2\alpha)^2}{4}.$$

The output of amplifier 40 is also applied to subtractor 42A, which combined with a $C\sqrt[3]{A}/2\angle \alpha$ signal out of amplifier 36B will equal $C/2(\sqrt[3]{A}\angle \alpha - \sqrt[3]{A^2}\angle 2\alpha)$. This output is applied to squarer 11B to produce a signal equal to $\frac{1}{4}(\sqrt[3]{A}\angle \alpha - \sqrt[3]{A^2}\angle 2\alpha)^2$. When this signal is applied to subtractor 42B along with the output of 11C, the result is $A/2(\angle \alpha + \angle 2\alpha)$. This signal is applied to subtractor 42C, which when combined with output $A/2\angle \alpha$ from amplifier 36A yields final output $A/2\angle 3\alpha$ which is triple the input frequency. The output of squarer 11B is also fed to lowpass filter 43, which supplies only the d.c. part $\frac{1}{8}(\sqrt[3]{A^2}+\sqrt[3]{A^4})$ to the gain controlled amplifier 10 for adjusting its gain. As in the doubler circuits of FIGS. 3 and 4 and the quadrupler circuit of FIG. 8, the circuit of FIG. 12 has the disadvantage of a loss in signal amplitude at the output terminal.

Figure 13:
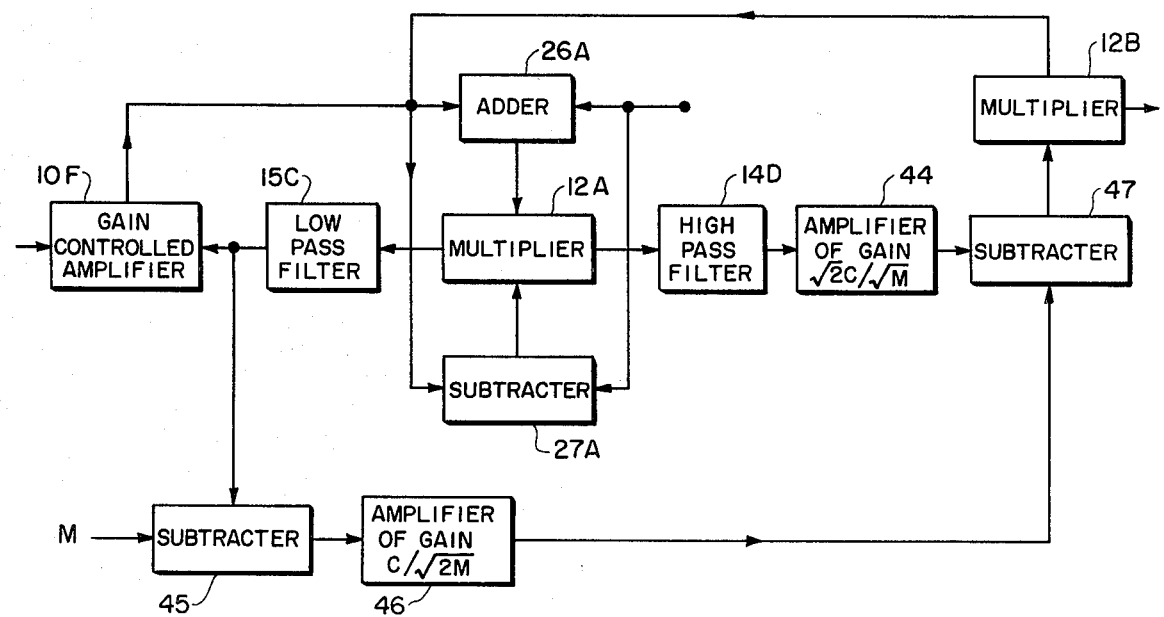
FIG. 13 is a frequency tripler circuit in which addition and subtraction operations are performed on the signal derived from the gain-controlled amplifier.

As in the case of the doubler of FIG. 5 and the quadrupler of FIG. 9, this loss of signal amplitude can be prevented by performing an addition and a subtraction of the input signal with a d.c. bias voltage $C\sqrt{M}$ prior to multiplication. Such a tripler circuit is shown in FIG. 13. The input signal $A\angle \alpha$ is applied to gain controlled amplifier 10F of gain $C\sqrt{2} / \sqrt[3]{A^2}$ when the control bias is $\sqrt[3]{MA^2} - M$ to provide an output which is applied to adder 26A and subtractor 27A which adder and subtractor also receive an input $C\sqrt{M}$ from a suitable d.c. source. The sum and difference outputs from adder 26A and subtractor 27A, viz., $C(\sqrt{2}-\sqrt[3]{A}\angle \alpha + \sqrt{M})$, are multiplied by multiplier 12A to produce an output $2\sqrt[3]{MA^2}(\angle \alpha)^2 - M$. The d.c. term $\sqrt[3]{MA^2} - M$ is removed in high pass filter 14D to obtain $\sqrt[3]{MA^2} \angle 2\alpha$; this signal is applied to amplifier 44 of gain $\sqrt{2C}/\sqrt{M}$ to produce an output $(C\sqrt{2}\sqrt[3]{A^2}/\quad)\angle 2\alpha$.

The output of multiplier 12A after removing of the a.c. component by low pass filter 15C becomes the bias voltage $\sqrt[3]{MA^2} - M$ for gain controlled amplifier 10F. This voltage also is applied to subtractor 45 along with a d.c. voltage M, to obtain a difference voltage $\sqrt[3]{MA^2}$. When this voltage is applied to amplifier 46 of gain $C/\sqrt{2M}$, an output from 46 is obtained which applied to subtractor 47 along with the output of amplifier 44 gives difference of $C\sqrt[3]{A^2}(2\angle 2\alpha - 1)/\sqrt{2}$. The output $\sqrt{2}C \quad \sqrt[3]{A}\angle\alpha$ from gain-controlled amplifier 10F is multiplied by multiplier 12B by the output from subtracter 47 to yield an output which reduces to $A\angle 3\alpha$.

The final multiplied output from multiplier 12B is thus three times the frequency of the input signal and of the same amplitude.

Figure 14:
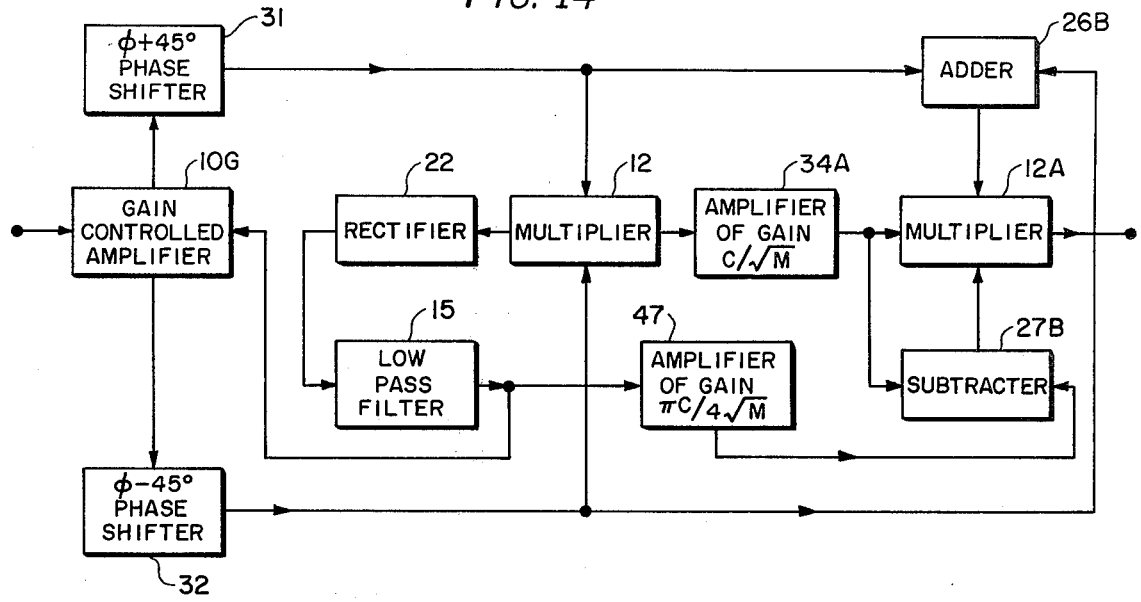
FIG. 14 is a frequency tripler circuit involving quadrature phase shifting of the signal from the gain-controlled amplifier.

As in the doubler circuit of FIG. 6 and the quadrupler circuit of FIG. 10, a phase shift can be accomplished prior to multiplication in order to obtain harmonic multiplication. Such a circuit is shown in FIG. 14. Here the input signal $A\angle\alpha$ is applied to gain-controlled amplifier 10G of gain $C\sqrt{2} \quad /\sqrt[3]{A^2}$ to obtain an output of $C\sqrt{2} \quad \sqrt[3]{A}\angle\alpha$; this output is applied to $\phi\pm 45°$ phase shifters 31 and 32 to derive respective outputs of $C\sqrt{2}$-$\sqrt[3]{A}\angle\alpha + \phi\pm 45°$.

These phase shifted outputs are multiplied by mulltiplier 12 to obtain an outpt $\sqrt[3]{MA^2}\angle 2(\alpha+\phi)$ for application to rectifier 22 and amplifier 34A of gain $C/\sqrt{M}$. After full wave rectification, the d.c. voltage of amplitude $|\sqrt[3]{MA^2}\angle 2(\alpha+\phi)|$ is passed through low pass filter 15 to remove the a.c. component and derive the d.c. component as a bias voltage $2\sqrt[3]{MA^2}/\pi$ for gain-controlled amplifier 10G. The output of multiplier 12, after amplification in amplifier 34A of gain $C/\sqrt{M}$, is applied as a signal $C\sqrt[3]{A^2}\angle 2(\alpha+\phi)/$ to subtracter 27B. The output of low pass filter 15 is also applied to subtractor 27B after first being converted to an amplitude $C\sqrt[3]{A^2}/2$ by means of amplifier 47 of $\pi C/4\sqrt{M}$ The outputs of the two phase shifters 31 and 32 are also applied to adder 26B. The output of adder 26B, $2C \quad \sqrt[3]{A}\angle 2(\alpha+\phi)$ and the output of subtractor 27B, $C\sqrt[3]{A^2}(\angle 2(\alpha+\phi)-\frac{1}{2})/$ are multiplied in 12A; the final output signal $$A\angle 3(\alpha+\phi)$$

is attained which is thrice for frequency of the input signal. As in the circuits of FIGS. 6 and 9, an additional phase shift has been introduced in the output signal.

Figure 15:
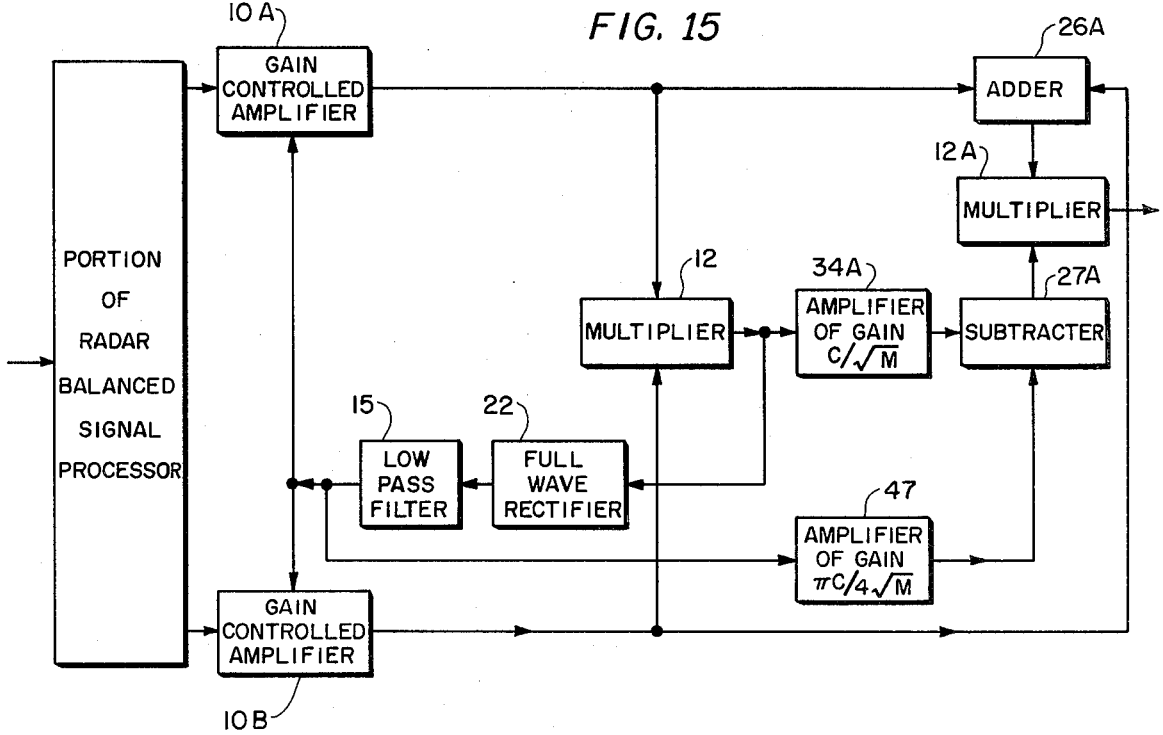
FIG. 15 is a frequency tripler circuit similar to FIG. 14 which is adapted for use with quadrature input signals.

In FIG. 15, as in the circuits of FIGS. 7 and 11, the two quadrature input signals from processor unit 9, are applied to corresponding gain-controlled amplifiers 10A and 10B which provide outputs of $C\sqrt{2}$-$\sqrt[3]{A}\angle\alpha\pm 45°$ when biased by the control voltage $2\sqrt[3]{MA^2}/\pi$. After multiplication by multiplier 12 of the outputs of the two gain-controlled amplifiers 10A and 10B, a signal $\sqrt[3]{MA^2}\angle 2\alpha$ is obtained. This multiplied signal is applied to the full wave rectifier 22 to provide a voltage $|\sqrt[3]{MA^2}\angle 2\alpha|$. After operation thereupon by low pass filter 15, the d.c. component of the full wave rectifier output is obtained, viz., $2\sqrt[3]{MA^2}/\pi$ for use as the bias voltage for the amplifiers 10A and 10B.

The multiplier 12 output $\sqrt[3]{MA^2}\angle 2\alpha$ is also applied to amplifier 34A of gain $C/\sqrt{M}$ to obtain a signal $C\sqrt[3]{A^2}\angle 2\alpha/$ which is applied to subtracter 27A along with a signal $C\sqrt[3]{A^2}/2$ derived by amplifying the bias voltage $2\sqrt[3]{MA^2}/\pi$ from filter 15 by amplifier 47 of gain $\pi C/4\sqrt{M}$. The phase shifted and amplified outputs from the two gain-controlled amplifiers 10A and 10B are applied to adder 26A to obtain an output signal $2C \quad \sqrt[3]{A^2}\angle\alpha$. Upon multiplication by multiplier 12A of the signals from the adder 26A and subtracter 27A, an output signal $A\angle 3\alpha$ is obtained which is three times the frequency of the signals $A\angle\alpha\pm 45°$.

What is claimed is:

1. A harmonic generator responsive to an incoming signal which changes slowly in both frequency and amplitude comprising gain-controlled amplifier means receptive of said incoming signal and positioned in a feedback loop including a multiplier means, low pass filter means disposed in the output of said multiplier means for deriving bias control voltage signals for regulation of the gain of said amplifier;

said multiplier means responding to output signals of said amplifier for providing multiplier output signals of amplitude proportional to the amplitude of said incoming signal and of a frequency which is double that of said incoming signal;

high pass filter means in the output of said multiplier means for removing from the same multiplier means output signls, the d.c. component;

addition and subtraction means for adding and subtracting of bias voltage before signals from the said means so as to decrease at maximum input voltage, the d.c. components of output.

2. A harmonic generator responsive to an incoming signal which changes slowly in both frequency and amplitude comprising gain-controlled amplifier means receptive of said incoming signals and positioned in a feedback loop including a two input multiplier means;

low pass filter means disposed in the output of said multiplier means for driving bias control voltage signals for regulation of the gain of said amplifier;

said multiplier means responding to output signals of said amplifier means for providing multiplier output signals of amplitude proportional to the amplitude of said incoming signal and of a frequency which is double that of said incoming signal;

phase shifter means for, prior to the step of signals being passed through the multiplier means, introducing a phase shift between the signals at the two inputs to the said multiplier means.

3. A harmonic generator responsive to an incoming signal which changes slowly in both frequency and amplitude comprising first gain-controlled amplifier means receptive of said incoming signal and positioned in a feedback loop including a multiplier element means;

low pass filter means disposed in the output of said multiplier element means for deriving bias control voltage signals for regulation of the gain of said first amplifier means;

second adjustable gain amplifier means to which quadrature input signals are applied from an outside source for producing signals for application to the said multiplier element means;

said multiplier element means responding to output signals of said first and second amplifier means for providing output signals of amplitude proportional to the amplitude of said incoming signal and of a frequency which is double that of said incoming signal.

4. A generator as in claim 1 wherein the frequency of the output signals from said multiplier means is quadruple that of said incoming signal.

5. A generator as in claim 2 wherein the frequency of the output signals from said multiplier means is quadruple that of said incoming signal.

6. A generator as in claim 3 wherein the frequency of the output signals from said multiplier means is quadruple that of said incoming signal.

7. A generator as in claim 2 wherein the frequency of the output signals from said multiplier means is triple that of said incoming signal.

8. A generator as in claim 3 wherein the frequency of the output signals from said multiplier means is triple that of said incoming signal.

9. A generator as in claim 1 wherein said multiplier means is a squarer element means.

* * * * *